United States Patent
Plevridis

(10) Patent No.: US 7,772,936 B2
(45) Date of Patent: Aug. 10, 2010

(54) POLAR FEEDBACK ARCHITECTURE

(75) Inventor: Sofoklis Plevridis, Glyfada (GR)

(73) Assignee: Broadcom Corporation, Irvine, CA (US)

( * ) Notice: Subject to any disclaimer, the term of this patent is extended or adjusted under 35 U.S.C. 154(b) by 283 days.

(21) Appl. No.: 12/115,082

(22) Filed: May 5, 2008

(65) Prior Publication Data

US 2009/0251231 A1   Oct. 8, 2009

Related U.S. Application Data

(60) Provisional application No. 61/042,616, filed on Apr. 4, 2008.

(51) Int. Cl.
*H03C 3/00* (2006.01)
*H04L 27/20* (2006.01)

(52) U.S. Cl. .................................... 332/103; 332/144

(58) Field of Classification Search ......... 332/103–105, 332/144–148
See application file for complete search history.

(56) References Cited

U.S. PATENT DOCUMENTS

2006/0071711 A1* 4/2006 Persson et al. .............. 330/149

* cited by examiner

*Primary Examiner*—David Mis
(74) *Attorney, Agent, or Firm*—Garlick Harrison & Markison; Shayne X. Short

(57) ABSTRACT

Polar feedback architecture. A polar modulator, as may be implemented within a transmitter module, of a communication device includes feedback. This feedback involves monitoring of phase information and magnitude/amplitude information of an output signal generated by the polar modulator. The output signal can be a radio frequency (RF) signal such as may be transmitted via a communication channel within a communication system. A baseband processing module processes the monitored phase information and magnitude/amplitude information to perform adjustment of a phase modulator and/or other components within the polar modulator.

20 Claims, 7 Drawing Sheets

POLAR FEEDBACK ARCHITECTURE

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/042,616, entitled "Polar feedback architecture,", filed Apr. 4, 2008, pending.

BACKGROUND OF THE INVENTION

1. Technical Field of the Invention

The invention relates generally to communication systems; and, more particularly, it relates to transmitter modules implemented within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera, communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

Within such prior art communication devices, open loop polar modulators are typically employed in accordance with transmit processing therein. These prior art open loop polar modulators have a number of deficiencies including a susceptibility to poor stability over temperature variations, process variations, aging, power supply variations, and/or other variations. The open loop implementation employed by such prior art open loop polar modulators typically requires open loop calibration. The only feedback employed within such prior art architectures is in accordance with Cartesian feedback, and such Cartesian feedback is applicable generally to only narrowband modulations (e.g., and as such is not well suited, if at all, to wideband applications). This Cartesian feedback also requires a separate I, Q receive path, is generally very difficult to co-integrate with a power amplifier (PA), and is typically very power inefficient.

There exists a need in the art for a means by which better transmitter architectures, including better designed polar modulators, may be implemented within communication devices (including wireless communication devices).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel architecture and means for a transmitter module is presented herein. Such a transmitter module may be implemented within a variety of types of communication devices which may themselves be implemented within a variety of types of communication systems.

Such a transmitter module constructed in accordance with certain aspects of the invention includes a phase modulator driving a power amplifier (PA). In some embodiments, a DC/DC amplitude/magnitude modulator is employed to control the PA. The PA can include an integrated envelope detector and/or be followed by a directional coupler to perform monitoring of the signal generated therein and output there from.

In the feedback path, a variable gain amplifier (VGA)/attenuator may be followed by one or both of another envelope detector and a mixer. If desired, when both the envelope detector and the mixer are implemented after the VGA, then a selection module can be employed to pass the output of one of them to a baseband processing module capable to perform modulation and adaption and to perform appropriate analysis of these feedback signals for decision making regarding subsequent adjustment (if necessary) of the elements of the polar transmitter to ensure desired operation. Before passing this amplitude/magnitude feedback information to the baseband processing module, it can pass through a separate VGA and/or a subsequent low pass filter (LPF) as well. Also in the feedback path, along the lines which provide phase feedback signal, a limiting amplifier can be employed in conjunction with a phase detector and/or a mixer.

Rather than performing Cartesian feedback (such as that which is performed in accordance with prior art approaches to open loop polar modulators), a closed loop polar modulator constructed in accordance with certain aspects of the invention provides for relatively much more stability than prior art designs over a wide range of temperature, process, and/or power supply variations. This also provides for a much easier to calibrate architecture than prior art approaches, and this novel architecture need not be calibrated at the factory (whereas the prior art approaches to open loop polar modulators do need factory calibration). Moreover, this novel architecture and means presented herein also provides for relatively straightforward and easy co-integration of the power amplifier (PA) of the polar modulator and is relatively much more power efficient compared to the prior art approaches.

Figure 1:
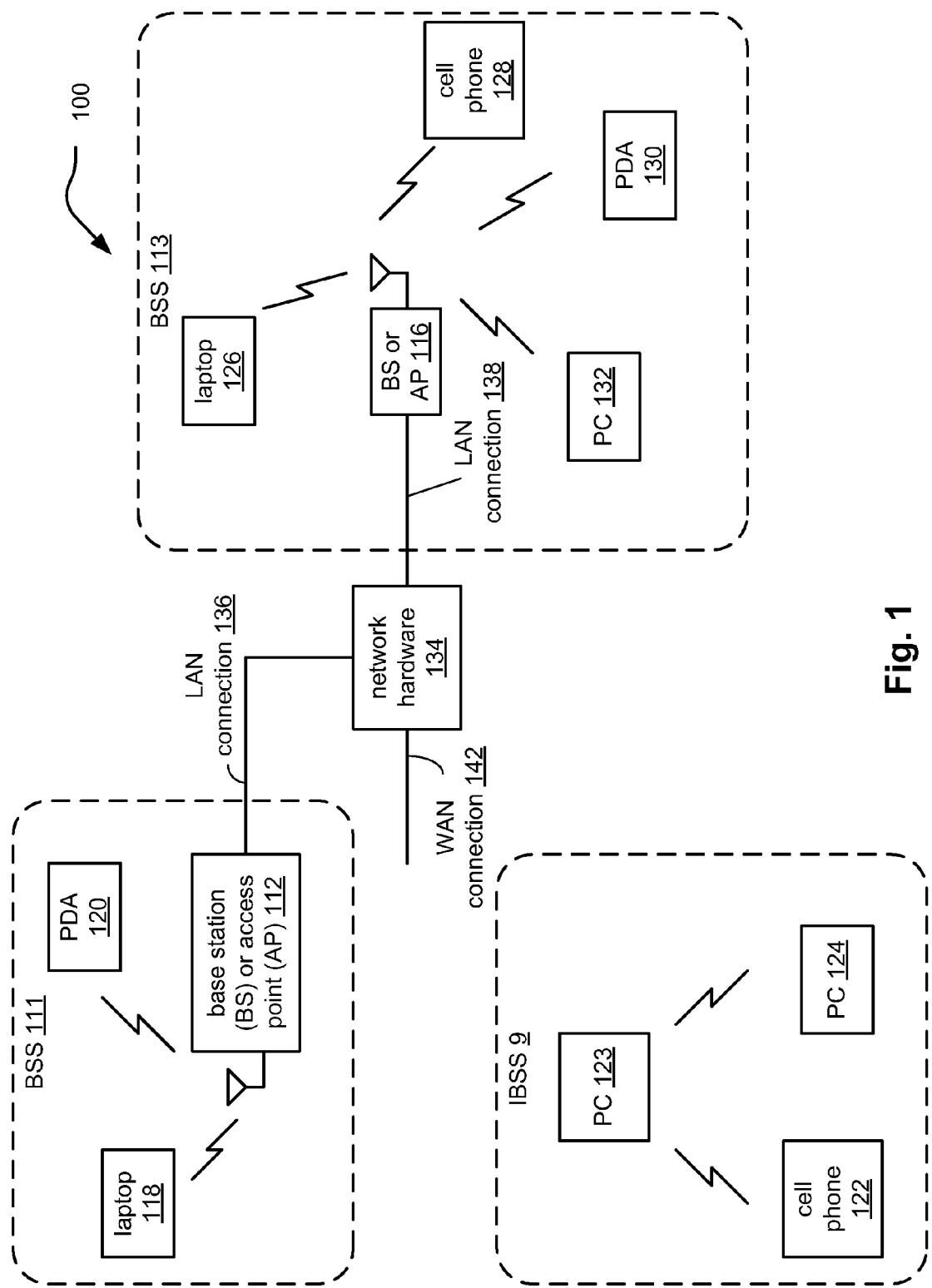
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera, provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
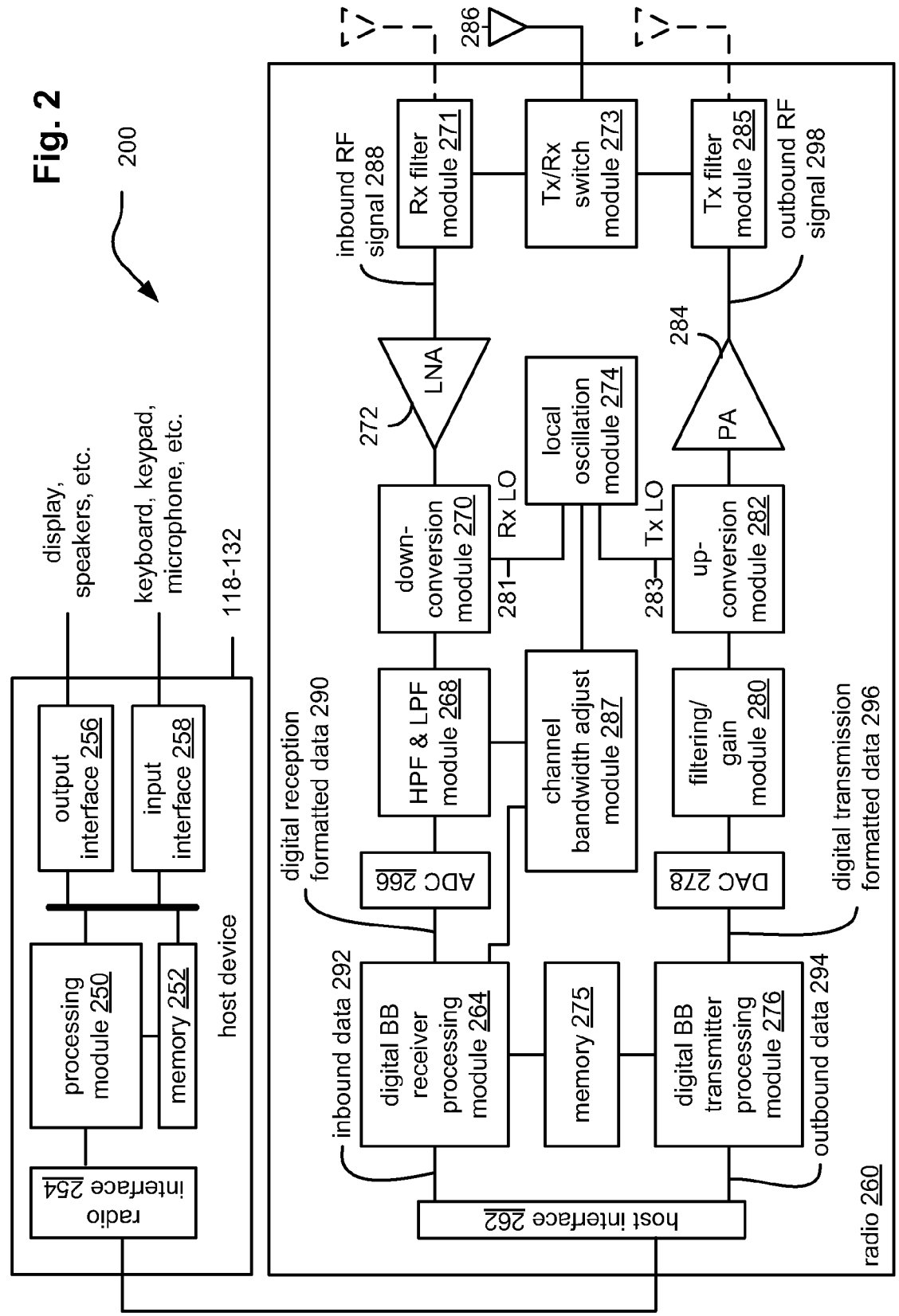
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera, via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
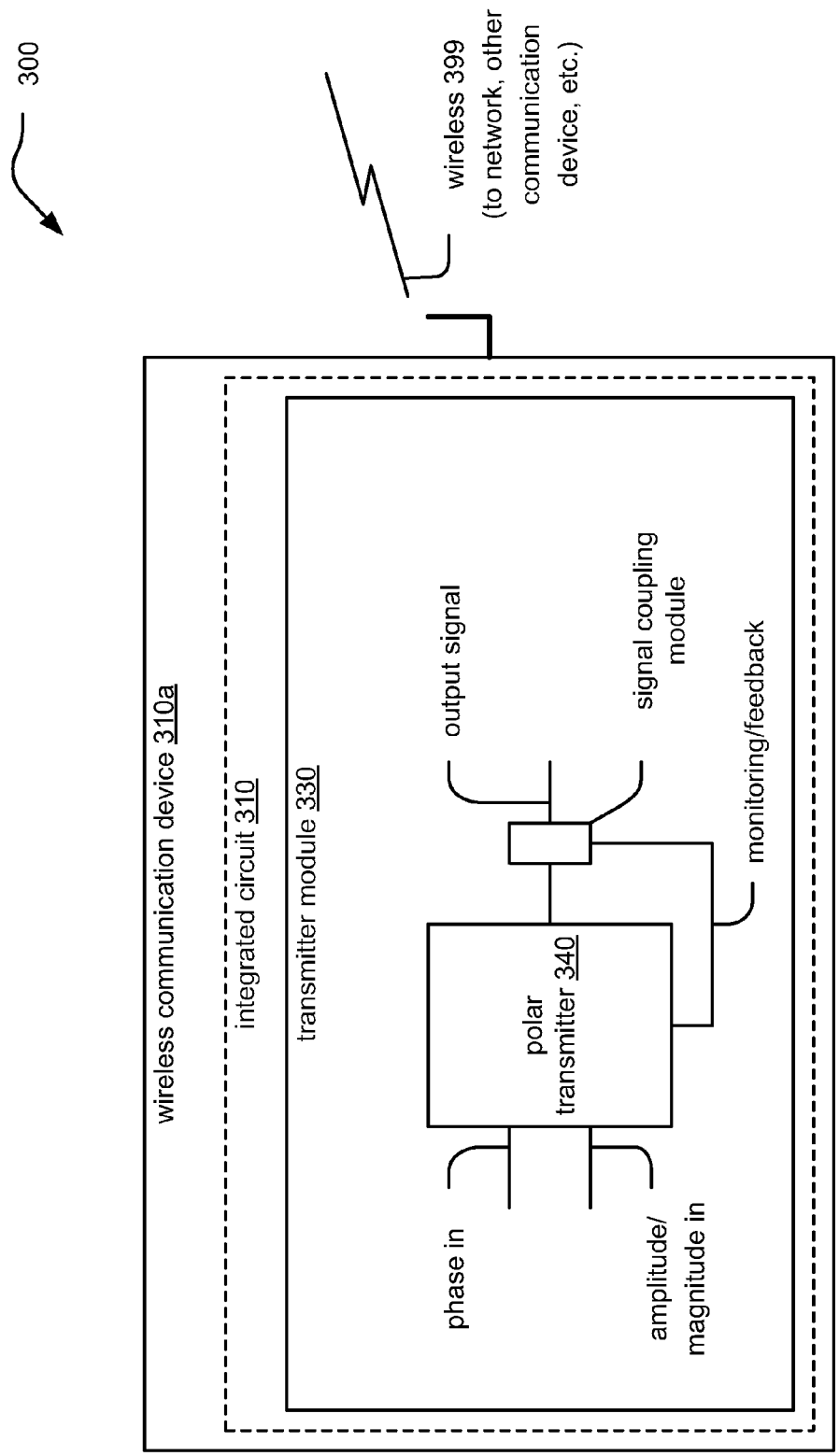
FIG. 3 is a diagram illustrating an alternative embodiment of a wireless communication system including a wireless communication device that includes a polar transmitter employing feedback.

FIG. 3 is a diagram illustrating an alternative embodiment of a wireless communication system 300 including a wireless communication device 310*a* that includes a polar transmitter 340 employing feedback.

The wireless communication device 310*a* can communicate via a wireless communication channel 399 to a communication network and/or one or more other communication devices. The wireless communication device 310*a* includes transmitter module 330 for generating an output analog signal (e.g., an radio frequency (RF) output signal) that can be transmitted via a communication channel.

The polar transmitter 340 operates by receiving a phase in signal and an amplitude/magnitude in signal. Based on these input control signals, the polar transmitter 340 generates an output signal that is fed back to the polar transmitter 340. a signal coupling module (e.g., a directional coupler in some embodiments or some other means) is employed to sample the output signal and provide that sampled portion of the output signal to the polar transmitter 340 so that it may make appropriate modifications to ensure that the output signal has the appropriate, desired characteristics.

Figure 4:
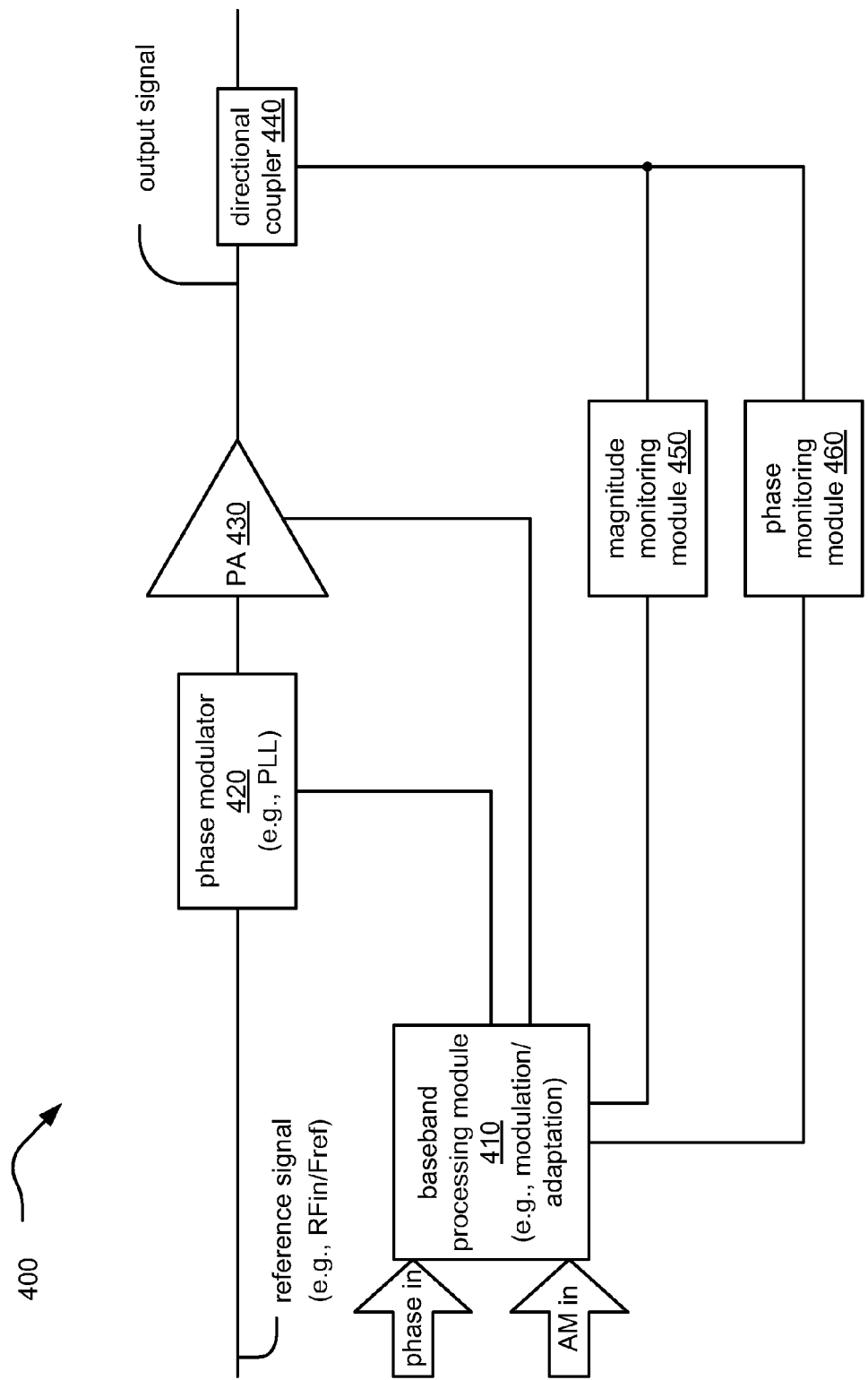
FIG. 4 is a diagram illustrating an embodiment of an apparatus that employs magnitude and phase monitoring to assist in modulation and adaptation of a phase modulator implemented therein.

FIG. 4 is a diagram illustrating an embodiment of an apparatus 400 that employs magnitude and phase monitoring to assist in modulation and adaptation of a phase modulator implemented therein. This apparatus 400 operates by receiving a phase in signal (shown as phase in) and an amplitude/ magnitude in signal (shown as AM in). These input control signals are provided to a baseband processing module 410 that is capable to determine what modulation and/or adaptation (if any, and if necessary) to control a phase modulator 420 that receives a reference signal (shown as RFin/Fref); this signal can be provided via a crystal or constant frequency source in some embodiments. The phase modulator 420 may be implemented as a phase locked loop (PLL) if desired in certain embodiments. The phase modulator 420 receives the reference signal and generates a driver signal for a power amplifier (PA) 430.

The driver signal output from the phase modulator 420 drives the PA 430. The output from the PA 430 is passed through a directional coupler 440 from which the signal is fed back to a magnitude monitoring module 450 and a phase monitoring module 460. The magnitude monitoring module 450 is implemented to detect a magnitude of the output signal, and the phase monitoring module 460 is implemented to detect a phase of the output signal.

The baseband processing module 410 is implemented to generate a phase control signal based on the detected magnitude and the detected phase of the output signal and to provide the phase control signal to the phase modulator 420. Based on the phase control signal, the phase modulator 420 adjusts a phase and/or frequency of the driver signal that is provided to the PA 430.

Figure 5:
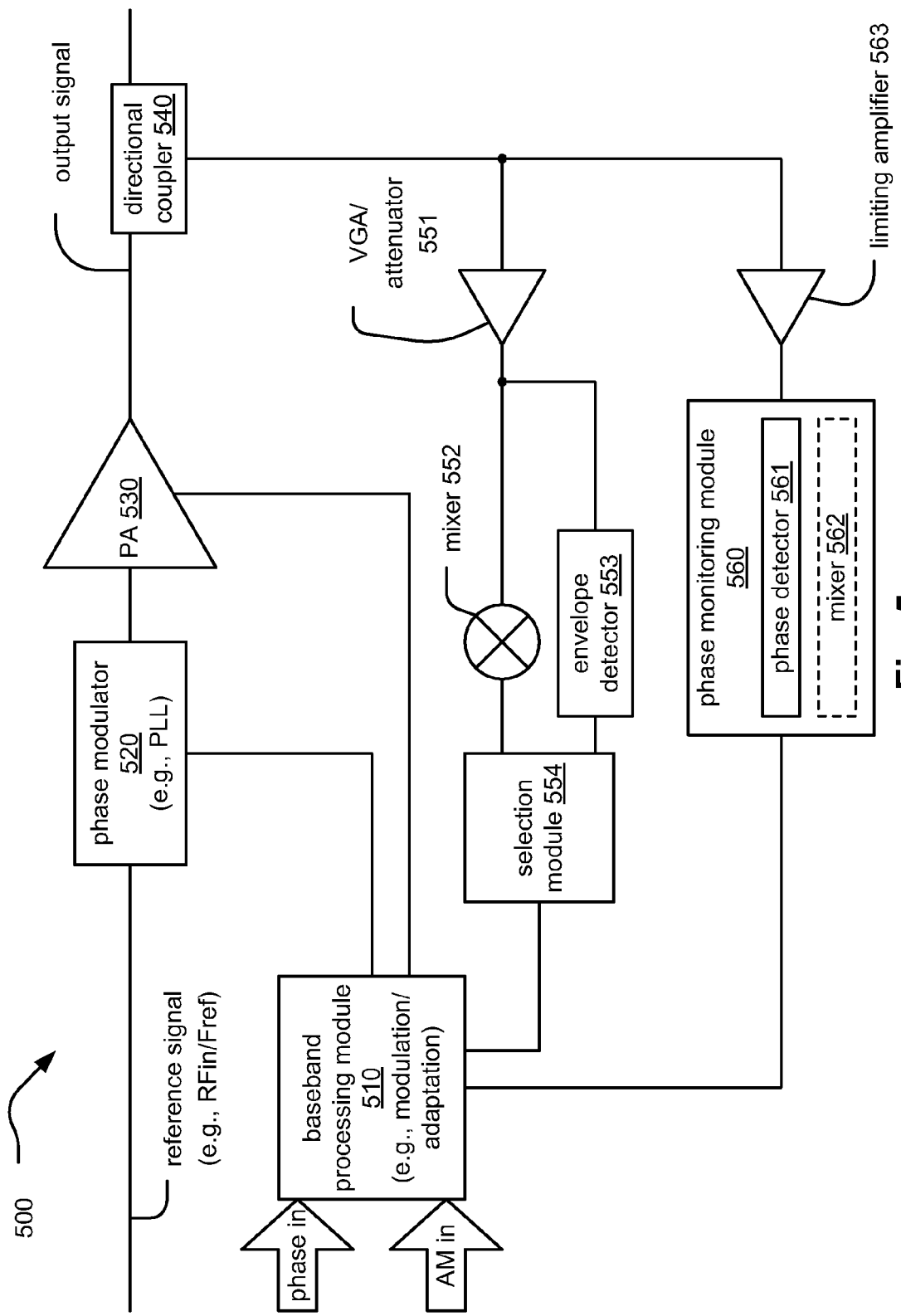
FIG. 5 is a diagram illustrating an alternative embodiment of an apparatus that employs magnitude and phase monitoring to assist in modulation and adaptation of a phase modulator implemented therein.

FIG. 5 is a diagram illustrating an alternative embodiment of an apparatus 500 that employs magnitude and phase monitoring to assist in modulation and adaptation of a phase modulator implemented therein.

This apparatus 500 operates by receiving a phase in signal (shown as phase in) and an amplitude/magnitude in signal (shown as AM in). These input control signals are provided to a baseband processing module 510 that is capable to determine what modulation and/or adaptation (if any, and if necessary) to control a phase modulator 520 that receives a reference signal (shown as RFin/Fref); this signal can be provided via a crystal or constant frequency source in some embodiments. The phase modulator 520 may be implemented as a phase locked loop (PLL) if desired in certain embodiments. The phase modulator 520 receives the reference signal and generates a driver signal for the PA 530.

The driver signal output from the phase modulator 520 drives the PA 530. The output from the PA 530 is passed through a directional coupler 540 from which the signal is fed back to a variable gain amplifier (VGA)/attenuator 551, the output of which is provided simultaneously to a mixer 552 and to an envelope detector 553. A selection module 554 selects the output from either the mixer 552 or the envelope detector 553 and provides it to the baseband processing module 510 as amplitude/magnitude information.

The output from the directional coupler 540 is also fed back to a limiting amplifier 563, the output of which is provided to a phase monitoring module 560 that includes a phase detector and/or a mixer 562. The output from the phase monitoring module 560 is also provided to the baseband processing module 510 as phase information.

Based on the analyzed amplitude/magnitude information and phase information, the baseband processing module 510 provides a phase and/or frequency adjust signal to the phase modulator 520. Based on that adjust signal, the phase modulator 520 can modify one or both of the phase and frequency of the driver signal that is provided to the PA 530.

Figure 6:
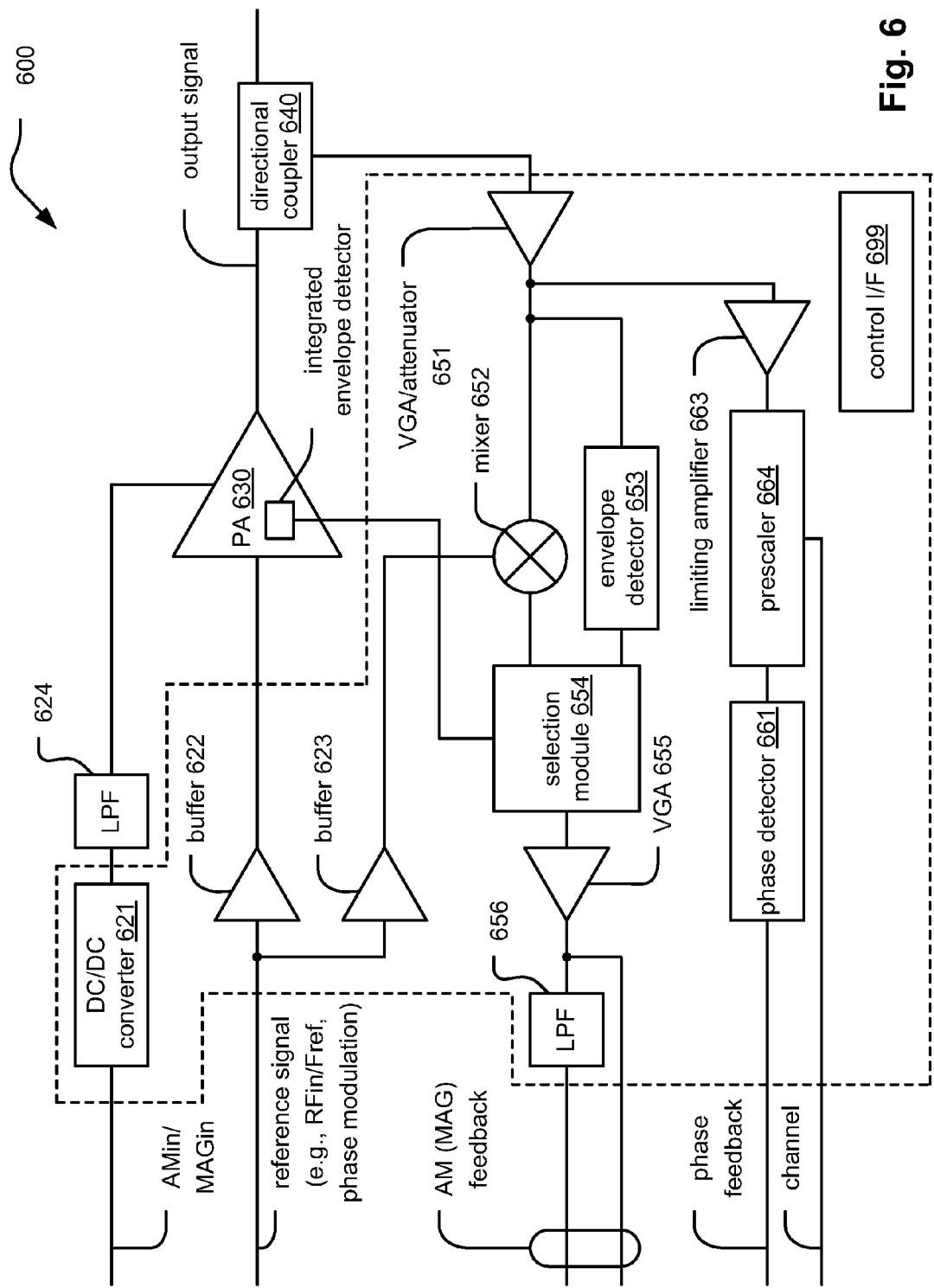
FIG. 6 is a diagram illustrating an embodiment of an apparatus that includes a polar transmitter employing feedback.

FIG. 6 is a diagram illustrating an embodiment of an apparatus 600 that includes a polar transmitter employing feedback. An amplitude in/magnitude in (AMin/MAGin) signal is provided to a DC/DC converter 621, the output of which is passed through a low pass filter (LPF) 624 before being passed to control a PA 630.

A reference signal is provided to a first buffer 622, the output of which is provided as the input to the PA 630. The reference signal is also passed to a second buffer 623, the output of which is used to select the conversion frequency of a mixer 652.

The PA 630 includes an integrated envelope detector to monitor the output signal generated therein and output there from. The output of the integrated envelope detector is provided to a selection module 654. The output signal from the PA 630 (e.g., which can be a radio frequency (RF) output signal) is passed through a directional coupler 640 from which the signal is fed back to a variable gain amplifier (VGA)/attenuator 651, the output of which is provided simultaneously to a mixer 652 and to an envelope detector 653. The VGA/attenuator 651 adjusts the level of this fed back signal based on the output transmit power (e.g., of the output signal). A selection module 654 selects the signal provided from the integrated envelope detector within the PA 630, the output from the mixer 652, or the output from the envelope detector 653 and provides it to a VGA 655 and/or subsequently through a low pass filter (LPF) 656 as amplitude/magnitude (AM (MAG)) information.

The output from the directional coupler 640, after passing through the VGA/attenuator 651, is also fed back to a limiting amplifier 663, the output of which is provided to a prescaler 664 (that translates phase information to a voltage), the output of which is provided to a phase detector 661, the output of which is phase information. Also, information from the prescaler 664 is provided as channel information as well.

It is noted that the apparatus 600 can operate in accordance with any one of multiple modes of operation. For example, in one mode, the selection module selects the signal provided from the integrated envelope detector within the PA 630. In another operational mode, the selection module selects the signal provided from the output from the mixer 652. In another operational mode, the selection module selects the signal provided from the output from the envelope detector 653. It is noted that when the components employed within one of these operational modes are being used, the components employed within the other two of these operational modes may be shut down for energy and power conservation and savings.

Moreover, depending on the particular operational characteristics needed or desired in a given operational mode, one of these various operational modes may be preferential. For example, mixer operational mode is perhaps more amenable to high power operation. In another mode, the use of the envelope detector (being better suited for lower power operational modes) may be preferential. The use of a baseband processing module can be employed to compensate for the non-linear operational characteristics of the envelope detector.

A control interface 699 also provides the ability to control any one or more of the components within the apparatus 600.

There are a wide variety of communication system contexts in which the apparatus 600 of this embodiment, or any other embodiment depicted herein, may be implemented including those that operate in accordance with different protocols and/or bands. Some examples of various RATs (Radio Access Technologies) include Global System for Mobile Communications (GSM), Enhanced Data Rates for GSM Evolution (EDGE), Code Division Multiple Access (CDMA), Wideband-Code Division Multiple Access (W-CDMA), UTRA-UTRAN Long Term Evolution (LTE) and 3GPP System Architecture Evolution (SAE), WiMAX (Worldwide Interoperability for Microwave Access), WiFi/WLAN (Wireless Local Area Network), ZigBee, Bluetooth, Ultra-Wide Band (UWB), and/or other types and variations thereof.

Figure 7:
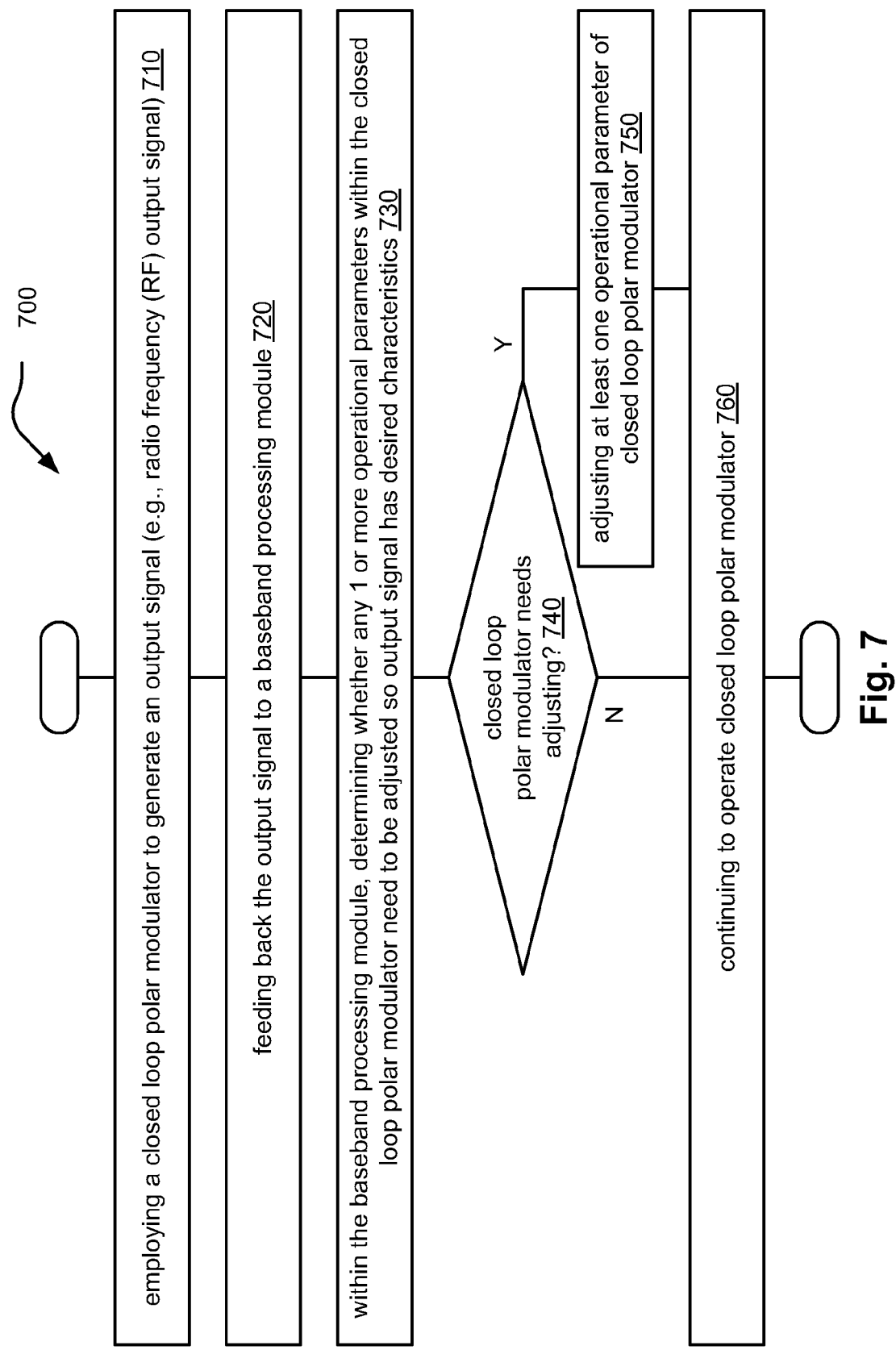
FIG. 7 is a diagram illustrating an embodiment of a method for operating a polar modulator.

FIG. 7 is a diagram illustrating an embodiment of a method 700 for operating a polar modulator.

The method 700 operates by employing a closed loop polar modulator to generate an output signal (e.g., radio frequency (RF) output signal), as shown in a block 710. The method 700 operates by feeding back the output signal to a baseband processing module, as shown in a block 720. The method 700 operates by within the baseband processing module, determining whether any 1 or more operational parameters within the closed loop polar modulator need to be adjusted so output signal has desired characteristics, as shown in a block 730.

In a decision block 740, the method 700 determines whether the closed loop polar modulator needs adjusting. If the closed loop polar modulator needs adjusting, then the method 700 operates by adjusting at least one operational parameter of closed loop polar modulator, as shown in a block 730, and then continuing to operate closed loop polar modulator, as shown in a block 760.

Alternatively, if the closed loop polar modulator does not needs adjusting, then the method 700 operates by merely continuing to operate closed loop polar modulator (in accordance with its original configuration), as shown in a block 760.

It is noted that the various modules (e.g., transmitter modules, baseband processing modules, other types of modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a phase modulator that receives a reference signal and generates a driver signal;
a power amplifier that receives the driver signal and generates an output signal;
a magnitude monitoring module implemented to detect a magnitude of the output signal;
a phase monitoring module implemented to detect a phase of the output signal; and
a baseband processing module implemented to generate a phase control signal based on the detected magnitude and the detected phase of the output signal and to provide the phase control signal to the phase modulator; and wherein:
based on the phase control signal, the phase modulator adjusts at least one of a phase and a frequency of the driver signal.

2. The apparatus of claim 1, wherein:
the magnitude monitoring module includes a variable gain amplifier and a mixer;
the variable gain amplifier is implemented to scale the output signal; and
the mixer is implemented to change a frequency of the output signal after the output signal has passed through the variable gain amplifier.

3. The apparatus of claim 1, wherein:
the magnitude monitoring module includes a variable gain amplifier and an envelope detector;
the variable gain amplifier is implemented to scale the output signal; and
the envelope detector detects the magnitude of the output signal after the output signal has passed through the variable gain amplifier.

4. The apparatus of claim 1, wherein:
the power amplifier includes a first envelope detector that is integrated within the power amplifier;
the magnitude monitoring module includes a selection module, a variable gain amplifier, a mixer, and a second envelope detector;
the variable gain amplifier is implemented to scale the output signal;
the mixer is implemented to change a frequency of the output signal after the output signal has passed through the variable gain amplifier;
the second envelope detector detects the magnitude of the output signal after the output signal has passed through the variable gain amplifier; and
based on a control signal provided from the first envelope detector, the selection module selects output from either the mixer or the second envelope detector and passes the selected output to the baseband processing module.

5. The apparatus of claim 1, wherein:
the phase monitoring module includes a limiting amplifier and a phase detector;
the limiting amplifier is implemented remove magnitude modulation information from the output signal; and
the phase detector detects the phase of the output signal after the output signal has passed through the limiting amplifier.

6. The apparatus of claim 1, wherein:
based on the detected magnitude and the detected phase of the output signal, the baseband processing module selects the phase control signals from a predetermined plurality of phase control signals.

7. The apparatus of claim 1, further comprising:
a directional coupler that provides the output signal to the phase monitoring module and the baseband processing module.

8. The apparatus of claim 1, wherein:
the apparatus is a multi-protocol and multi-band capable communication device that operates in accordance with a first protocol and band pair during a first time and in accordance with a second protocol and band pair during a second time;
the analog signal is a first analog signal;
when operating in accordance with the first protocol and band pair, the output signal has a first frequency; and
when operating in accordance with the second protocol and band pair, the output signal has a second frequency.

9. The apparatus of claim 1, wherein:
the apparatus is an integrated circuit.

10. The apparatus of claim 1, wherein:
the apparatus is a wireless communication device.

11. An integrated circuit, comprising:
a phase modulator, that includes an integrated envelope detector, that receives a reference signal and generates a driver signal;
a power amplifier that receives the driver signal and generates an output signal;
a magnitude monitoring module implemented to detect a magnitude of the output signal, wherein the magnitude monitoring module includes a selection module, a variable gain amplifier, a mixer, and a second envelope detector;
a phase monitoring module implemented to detect a phase of the output signal; and
a baseband processing module implemented to generate a phase control signal based on the detected magnitude and the detected phase of the output signal and to provide the phase control signal to the phase modulator; and wherein:

based on the phase control signal, the phase modulator adjusts at least one of a phase and a frequency of the driver signal;

the variable gain amplifier is implemented to scale the output signal;

the mixer is implemented to change a frequency of the output signal after the output signal has passed through the variable gain amplifier;

the second envelope detector detects the magnitude of the output signal after the output signal has passed through the variable gain amplifier; and based on a control signal provided from the first envelope detector, the selection module selects output from either the mixer or the second envelope detector and passes the selected output to the baseband processing module.

12. The integrated circuit of claim 11, wherein:

the phase monitoring module includes a limiting amplifier and a phase detector;

the limiting amplifier is implemented remove magnitude modulation information from the output signal; and the phase detector detects the phase of the output signal after the output signal has passed through the limiting amplifier.

13. The integrated circuit of claim 11, wherein:

based on the detected magnitude and the detected phase of the output signal, the baseband processing module selects the phase control signals from a predetermined plurality of phase control signals.

14. The integrated circuit of claim 11, wherein:

a directional coupler that provides the output signal to the phase monitoring module and the baseband processing module.

15. The integrated circuit of claim 11, wherein:

the integrated circuit is implemented in a multi-protocol and multi-band capable communication device that operates in accordance with a first protocol and band pair during a first time and in accordance with a second protocol and band pair during a second time;

the analog signal is a first analog signal;

when operating in accordance with the first protocol and band pair, the output signal has a first frequency; and when operating in accordance with the second protocol and band pair, the output signal has a second frequency.

16. The integrated circuit of claim 11, wherein:

the integrated circuit is implemented within a wireless communication device.

17. An integrated circuit, comprising:

a phase modulator, that includes an integrated envelope detector, that receives a reference signal and generates a driver signal;

a power amplifier that receives the driver signal and generates an output signal;

a magnitude monitoring module implemented to detect a magnitude of the output signal, wherein the magnitude monitoring module includes a selection module, a variable gain amplifier, a mixer, and a second envelope detector;

a phase monitoring module, that includes a limiting amplifier and a phase detector, implemented to detect a phase of the output signal;

a directional coupler that provides the output signal to the phase monitoring module and the baseband processing module; and a baseband processing module implemented to generate a phase control signal based on the detected magnitude and the detected phase of the output signal and to provide the phase control signal to the phase modulator; and wherein:

based on the phase control signal, the phase modulator adjusts at least one of a phase and a frequency of the driver signal;

the variable gain amplifier is implemented to scale the output signal;

the mixer is implemented to change a frequency of the output signal after the output signal has passed through the variable gain amplifier;

the second envelope detector detects the magnitude of the output signal after the output signal has passed through the variable gain amplifier;

based on a control signal provided from the first envelope detector, the selection module selects output from either the mixer or the second envelope detector and passes the selected output to the baseband processing module;

the limiting amplifier is implemented remove magnitude modulation information from the output signal after the output signal has passed through the variable gain amplifier;

the phase detector detects the phase of the output signal after the output signal has passed through the limiting amplifier; and based on the detected magnitude and the detected phase of the output signal, the baseband processing module selects the phase control signals from a predetermined plurality of phase control signals.

18. The integrated circuit of claim 17, further comprising:

a low pass filter (LPF) that filters the selected output from either the mixer or the second envelope detector before it is passed to the baseband processing module.

19. The integrated circuit of claim 17, wherein:

the integrated circuit is implemented in a multi-protocol and multi-band capable communication device that operates in accordance with a first protocol and band pair during a first time and in accordance with a second protocol and band pair during a second time;

the analog signal is a first analog signal;

when operating in accordance with the first protocol and band pair, the output signal has a first frequency; and when operating in accordance with the second protocol and band pair, the output signal has a second frequency.

20. The integrated circuit of claim 17, wherein:

the integrated circuit is implemented within a wireless communication device.

* * * * *

UNITED STATES PATENT AND TRADEMARK OFFICE
CERTIFICATE OF CORRECTION

PATENT NO. : 7,772,936 B2  Page 1 of 1
APPLICATION NO. : 12/115082
DATED : August 10, 2010
INVENTOR(S) : Sofoklis Plevridis It is certified that error appears in the above-identified patent and that said Letters Patent is hereby corrected as shown below:

Column 12, line 19, in Claim 5: replace "implemented remove" with --implemented to remove--.
Column 13, line 19, in Claim 12: replace "implemented remove" with --implemented to remove--.
Column 14, line 27, in Claim 17: replace "implemented remove" with --implemented to remove--.

Signed and Sealed this

Twenty-sixth Day of October, 2010

David J. Kappos
*Director of the United States Patent and Trademark Office*